United States Patent [19]

Eastep

[11] Patent Number: 5,498,569
[45] Date of Patent: Mar. 12, 1996

[54] LAYERED LOCAL INTERCONNECT COMPATIBLE WITH INTEGRATED CIRCUIT FERROELECTRIC CAPACITORS

[75] Inventor: Brian Eastep, Black Forest, Colo.

[73] Assignee: Ramtron International Corporation, Colorado Springs, Colo.

[21] Appl. No.: 294,077

[22] Filed: Aug. 22, 1994

[51] Int. Cl.⁶ .................................. H01L 21/44
[52] U.S. Cl. .................. 437/187; 437/245; 437/246; 437/52
[58] Field of Search ................... 437/187, 201, 437/245, 246, 919, 247; 148/DIG. 14

[56] References Cited

U.S. PATENT DOCUMENTS

| | | | |
|---|---|---|---|
| 5,320,971 | 6/1994 | Eklund et al. | 437/31 |
| 5,374,578 | 12/1994 | Patel et al. | 437/52 |

FOREIGN PATENT DOCUMENTS

| | | |
|---|---|---|
| 0494313 | 7/1992 | European Pat. Off. . |
| 58-046631 | 3/1983 | Japan . |

OTHER PUBLICATIONS

Hayashida, et al. "Manufactuable Local Interconnect Technology Fully Compatible With Titanium Salicide Process." Jun. 11–12, 1991. VMIC Conference. pp. 332–334.

Primary Examiner—Olik Chaudhuri
Assistant Examiner—C. Everhart
Attorney, Agent, or Firm—Peter J. Meza

[57] ABSTRACT

A method of forming a local interconnect for a ferroelectric memory cell includes the steps of simultaneously opening top electrode and source/drain contacts to the ferroelectric memory cell, sputtering a first blanket metal layer comprised of platinum or palladium on a top surface of the ferroelectric memory cell, annealing the ferroelectric memory cell to simultaneously recover damage in a ferroelectric capacitor dielectric of the memory cell, and to silicidize the first metal layer in the source/drain contact, sputtering a second blanket metal layer comprised of titanium nitride on a top surface of the first metal layer, and selectively etching the first and second metal layers to form the local interconnect between the top electrode and source/drain contacts of the ferroelectric memory cell.

20 Claims, 6 Drawing Sheets

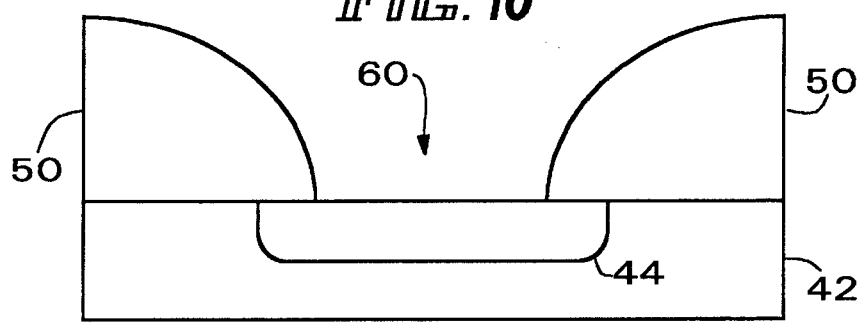
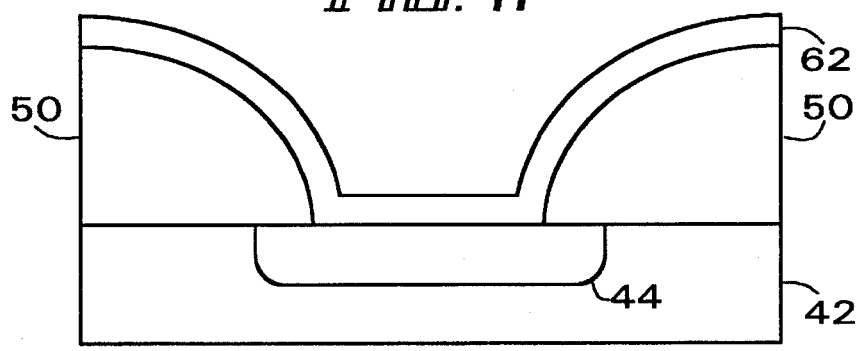
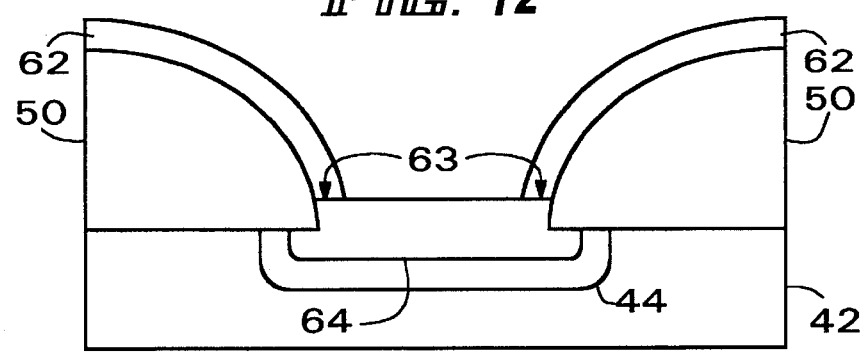
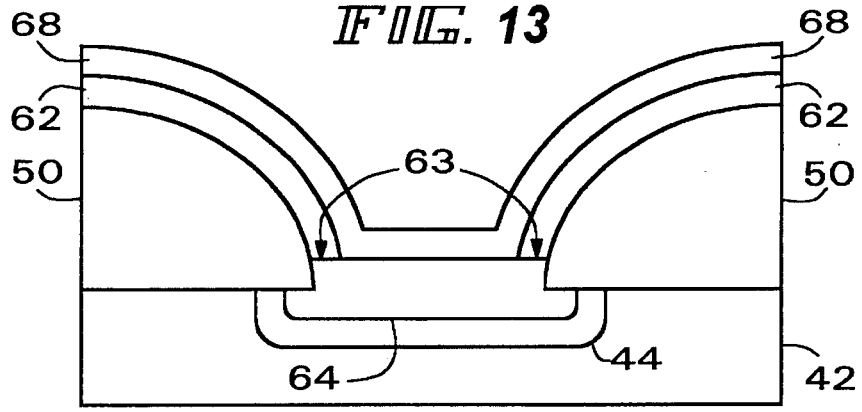

LAYERED LOCAL INTERCONNECT COMPATIBLE WITH INTEGRATED CIRCUIT FERROELECTRIC CAPACITORS

BACKGROUND OF THE INVENTION

This invention relates generally to a local interconnect metallization process for an integrated circuit. More particularly, the present invention relates to a layered local interconnect that can be fabricated in a manner that is compatible with ferroelectric capacitors and ferroelectric memory circuits.

Local interconnect has been widely used in DRAM applications to increase packing density and reduce parasitics. In typical DRAM applications, the local interconnect is used to provide a localized conductive path between the gating transistor of a memory cell and the corresponding storage element, which can be a capacitor or the gate of an adjacent transistor used as a capacitor. A typical local interconnect for a DRAM memory cell 10 is shown in the cross-sectional diagram of FIG. 1. Memory cell 10 includes a storage element and a gating transistor located generally at 10A and 10B, respectively. Memory cell 10 is thus a one transistor, one capacitor ("1T-1C") type of cell. The storage element in FIG. 1 is an MOS transistor configured as a capacitor (a "capacitor-connected transistor"), although a separate trench capacitor or other types of integrated capacitors can be used. The capacitor-connected transistor 10A is configured so that its gate 18A serves as one electrode of a capacitor and source/drain regions 14A and 14B are coupled together and serve as the other electrode of the capacitor. The actual coupling of source/drain regions 14A and 14B and subsequent metallization thereto is not in the plane of FIG. 1 and is therefore not shown. The portion of oxide layer 20A underneath gate 18A serves as the dielectric material for the capacitor-connected transistor 10A. Gating transistor 10B includes a gate 18B, and source/drain regions 14C and 14D. The portion of oxide layer 20B underneath gate 18B serves as the gate oxide for transistor 10B. Capacitor 10A and transistor 10B are fabricated on a substrate 12, generally silicon, and are electrically isolated from each other with a field oxide layer 16B. Memory cell 10 is isolated from other such cells in an integrated memory array through field oxide layers 16A and 16C.

In a typical DRAM local interconnect process, the local interconnect is fabricated using a second level of polysilicon or polycide such as tungsten silicide (WSi) or titanium silicide ($TiSi_2$). The first level of polysilicon is typically used for transistor gates 18A and 18B. As shown in FIG. 1, this second level of polysilicon 22 electrically ties source/drain region 14C of transistor 10B to gate 18A, which is the top electrode of capacitor 10A. Local interconnect 22, therefore, completes the; electrical connection between the two components of memory cell 10. The exact configuration of local interconnect 22 is often altered from that shown in FIG. 1 depending on the storage and access requirements of the DRAM user and the metal interconnect layout fabricated later in the process. In FIG. 1, another oxide layer 24A is formed on the surface of local interconnect 22 (with oxide layer 24B forming on oxide layer remnant 20C). Oxide layers 20 and 24 are etched to expose source/drain region 14D. A metal interconnect 26 is formed to contact source/drain region 14D.

An equivalent electrical schematic of DRAM memory cell 10 is shown in FIG. 2. Memory cell 10 includes a gating transistor 10B and a capacitor 10A. The top electrode of capacitor 10A is designated 18A to correspond to gate 18A shown in FIG. 1. Similarly, the bottom electrode of capacitor 10A is designated 14A, 14B to correspond to source/drain regions 14A and 14B shown in FIG. 1. The bottom electrode node of capacitor 10A is also designated "VCC/2", which is the reference voltage normally applied to this node in most DRAM applications. The gate of transistor 10B is designated 18B to correspond to the gate, shown in FIG. 1, and is also designated "WL", corresponding to the word line connection used in a typical DRAM cell. The "top" source/drain region of transistor 10B is designated 14D, 26, which corresponds to source/drain region 14D and metal interconnect layer 26 shown in FIG. 1. This node is also designated "BL", corresponding to the bit line connection used in a typical DRAM cell. The "bottom" source/drain region of transistor 10B is designated 14C, which corresponds to source/drain region 14C shown in FIG. 1. Finally, the desired local interconnect 22 is shown as a dotted line, which electrically connects capacitor 10A to transistor 10B to complete the cell.

In many DRAM approaches, the transistors and storage elements are fabricated simultaneously (i.e. the storage element is typically the gate region of a transistor) with the same dielectric material, silicon dioxide ($SiO_2$). However, in the fabrication of a ferroelectric memory, the transistor gates and storage elements typically include different dielectric materials. Silicon dioxide is used to form the transistor gates, whereas the storage element includes a ferroelectric dielectric material such as lead zirconate titanate (PZT). Because different materials are used, the ferroelectric storage elements (ferroelectric capacitors) are fabricated at a later process step and are typically fabricated close to or on top of the earlier fabricated memory cell transistor.

The typical DRAM local interconnect may not be useable in a ferroelectric memory cell because of these differences in the process flow. For example, polysilicon cannot be used to contact PZT directly because it will substantially impair the switching characteristics of this material. It is essential, therefore, that a local interconnect for a ferroelectric memory cell be compatible with the ferroelectric material used and also be compatible with conventional integrated circuit fabrication techniques.

What is desired is there, fore, is a method of forming a local interconnect that is compatible with an integrated circuit ferroelectric memory cell.

SUMMARY OF THE INVENTION

It is, therefore, a principal object of the present invention to provide a layered local interconnect for a ferroelectric memory cell having a low sheet resistivity of less than ten ohms per square that can be manufactured in an integrated circuit process that is compatible with ferroelectric capacitors.

It is another object of the invention to provide a layered low sheet resistivity interconnect for connecting any two points on an integrated circuit that can be manufactured in an integrated circuit process that is compatible with ferroelectric capacitors.

It is an advantage of the invention that the layered interconnect presents a low contact resistance to N+ and P+ doped source/drain regions.

It is another advantage of the invention that sheet resistivity of the layered interconnect can be further reduced when it is placed directly over silicon.

It is another advantage of the invention that certain etching steps in the local interconnect process can be combined to further enhance manufacturability.

According to the present invention a method of forming a local interconnect for a ferroelectric memory cell includes the steps of simultaneously opening top electrode and source/drain contacts to the ferroelectric memory cell, sputtering a first blanket metal layer comprised of platinum or palladium on a top surface of the ferroelectric memory cell, annealing the ferroelectric memory cell to simultaneously recover damage in a ferroelectric capacitor dielectric of the memory cell, and to silicidize the first metal layer in the source/drain contact, sputtering a second blanket metal layer comprised of titanium nitride on a top surface of the first metal layer, and selectively etching the first and second metal layers to form the local interconnect between the top electrode and source/drain contacts of the ferroelectric memory cell.

In a preferred embodiment, the first metal layer is about 300 to 500 Angstroms thick, and the second metal layer is about 500 to 1000 Angstroms thick. The thicknesses of the first and second metal layers are controlled so that the sheet resistance of the resultant layered local interconnect is less than ten ohms per square: The annealling step is performed at a temperature between 450° and 700° C. for a duration of between 30 and 90 minutes in an oxygen ambient environment. The selective etching step is performed with conventional photolithography and etching techniques. A single pattern is used for both metal layers, which are etched in one process step, enhancing manufacturability.

Simultaneous with the formation of the layered local interconnect for the ferroelectric memory cell, the same local interconnect using the same process steps can be formed for connecting any two points on the ferroelectric memory integrated circuit, including those not associated with the ferroelectric memory cell array. Since the same processing steps are used, and only the location of the interconnect is changed, the local interconnect used in other parts of the integrated circuit is also therefore compatible with the ferroelectric capacitors. The resistivity of the local interconnect used between any two points in the integrated circuit will be about four to ten ohms per square. This resistivity can be further reduced by opening a contact to the silicon substrate between the first point and the second point on the integrated circuit. The portion of the interconnect that passes over the silicon contact silicidizes, which can lower resistivity to less than two ohms per square.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIGS. 10 through 13 are cross sectional diagrams of the source/drain contact portion of a ferroelectric memory cell illustrating the local interconnect process flow of the present invention in further detail, particularly with respect to the silicidation of the source/drain contact;

DETAILED DESCRIPTION

Figure 1:
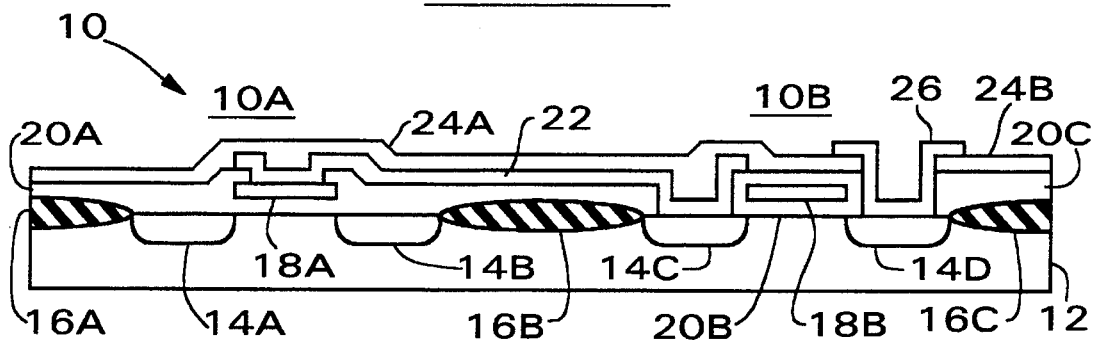
FIG. 1 is a cross sectional diagram of a 1T-1C DRAM cell illustrating a prior art local interconnect process flow.
Figure 2:
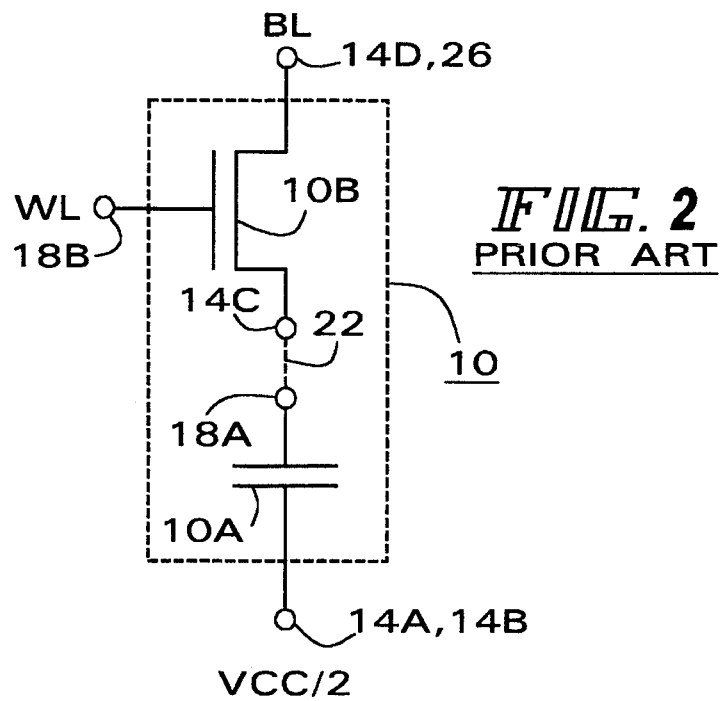
FIG. 2 is a schematic diagram of a 1T-1C ferroelectric memory cell corresponding to the one shown in FIG. 1.
Figure 3:
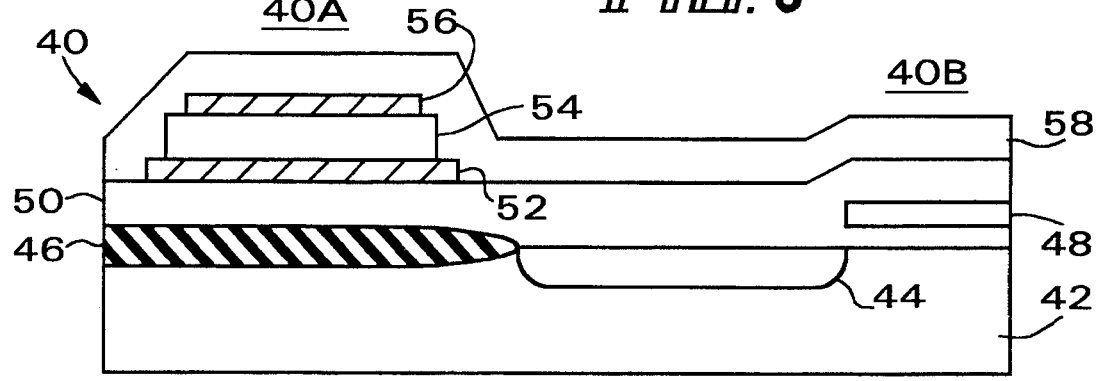
FIGS. 3 through 8 are cross sectional diagrams of a ferroelectric memory cell illustrating the local interconnect process flow of the present invention.
Figure 4:
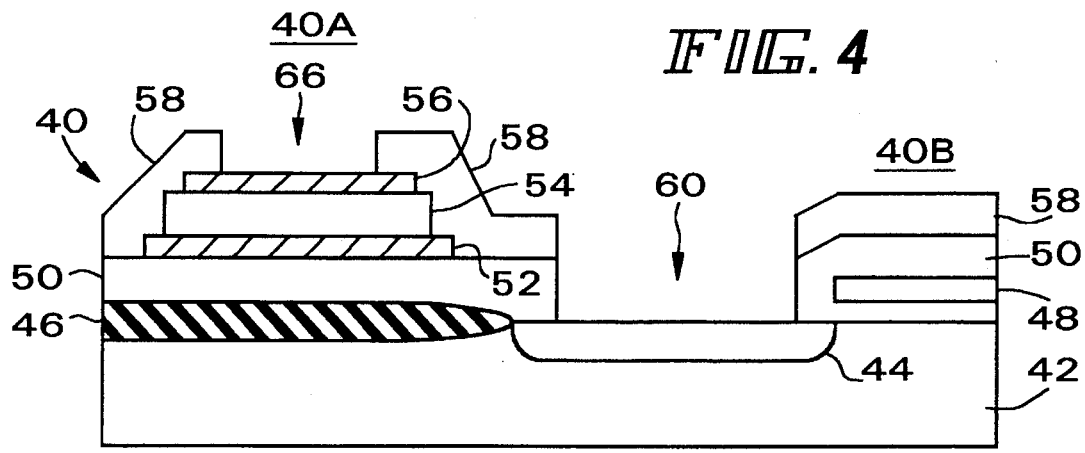

Referring now to FIG. 3, a partially processed ferroelectric memory cell 40 is shown, which is part of a memory array on a ferroelectric memory integrated circuit. Memory cell 40 is to be further processed according to the local interconnect method of the present invention and includes a ferroelectric capacitor located generally at 40A and an MOS transistor located generally at 40B. Memory cell transistor 40B is fabricated in a silicon substrate 42. Transistor 40B includes two doped source/drain regions, only one of which is shown in FIG. 3, source/drain region 44. Transistor 40B is isolated from other memory cells 40 with thick field oxide regions, one of which is shown in FIG. 3, thick field oxide 46. A transistor gate 48 is separated from the silicon substrate 42 by a thin gate oxide and surrounded and insulated by a reflow oxide layer 50. A portion of gate 48 is shown in FIG. 3. The ferroelectric capacitor stack 40A is fabricated on top of the reflow oxide layer 50. The ferroelectric capacitor stack 40A is comprised of a bottom electrode 52, usually a noble metal such as platinum or palladium, a dielectric layer 54 comprised of a ferroelectric material such as phase III potassium nitrate, doped or undoped lead zirconate titanate (PZT), bismuth layered compounds, or other known ferroelectric materials, and a top electrode 56, also usually a noble metal such as platinum or palladium. Once ferroelectric capacitor 40A has been formed, another interdielectric oxide layer 58 is formed, which covers the entire surface of memory cell 40. Ferroelectric memory cell 40 shown in FIG. 3 is only partially formed in that there is no electrical connection between the top electrode 56 of the ferroelectric capacitor 40A and the source/drain region 44. The local interconnect metallization scheme for providing this contact according to the present invention is described in detail below.

The processing method of providing a local interconnect for memory cell 40 is shown in the cross sectional drawings of FIGS. 3–8. Starting with FIG. 4, two contacts 60 and 66 are simultaneously opened to expose source/drain region 44 and the upper surface of top electrode 56, respectively. Contact 60 is opened through oxide layers 50 and 58, while contact 66 is opened through oxide layer 58. Contacts 60 and 66 are opened using conventional photolithography and etching techniques.

Figure 5:
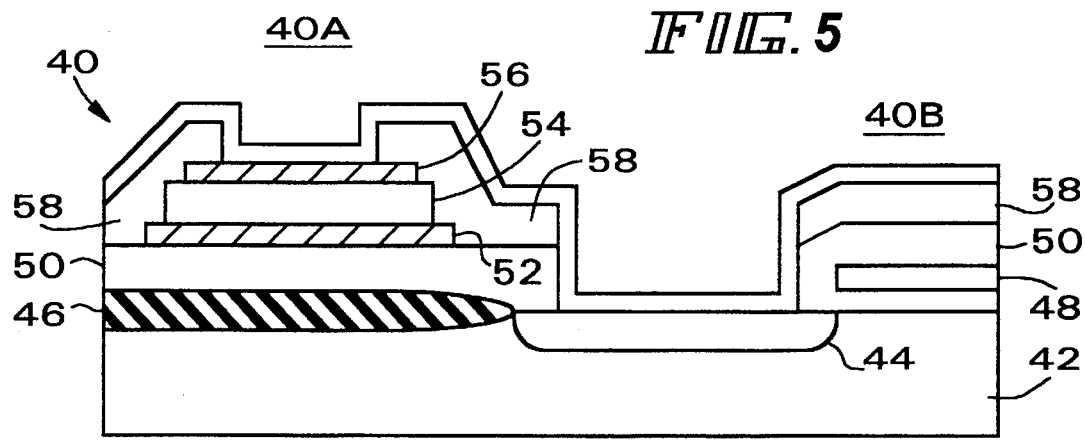
Figure 6:
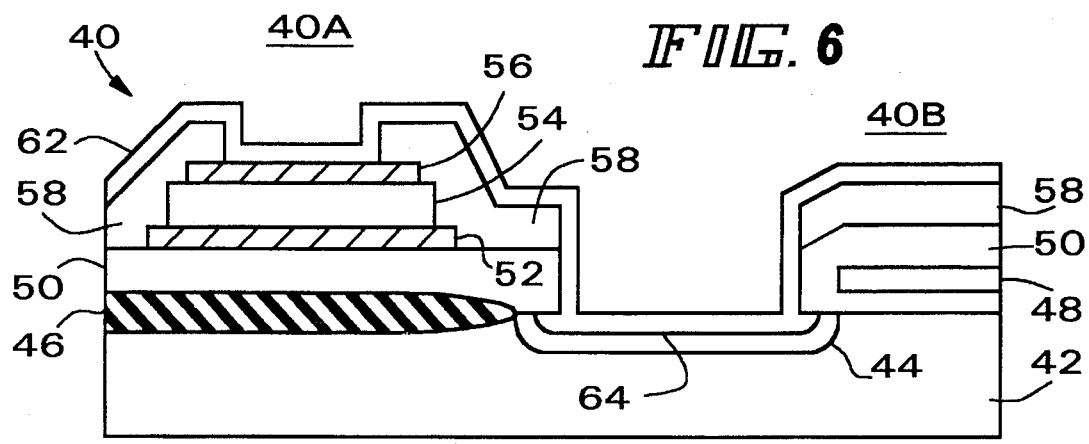

In FIG. 5, a blanket layer 62 of platinum or palladium is sputtered onto the surface of memory cell 40 in an argon ambient environment to a thickness of about 300 to 500 Angstroms. Before metal layer 62 is deposited, a brief in situ sputter precleaning step is performed that removes about fifty Angstroms of equivalent thermal oxide. After the platinum layer 62 has been deposited, a single silicidation anneal is performed in an oxygen ambient environment to simultaneously silicidize a portion of source/drain region 44 and to repair any damage in the ferroelectric layer 54 of ferroelectric capacitor 40A. The silicidation anneal transforms a portion of source/drain region 44 into platinum silicide (PtSi) taking the silicon from source/drain region 44, and the platinum from metal layer 62. The silicidation anneal, since it is performed in oxygen, also repairs any damage to the ferroelectric layer 54, which is usually PZT. The benefit of the anneal has been demonstrated empirically, but the mechanism for providing the benefit is not well understood in the current state of the art. The silicidation anneal is performed at a temperature of about 450° to 700° C. for a duration of about 30 to 90 minutes in an oxygen ambient environment. An anneal temperature of above 550° C. is preferred. Once source/drain region 44 is silicidized, the remaining portion of the platinum layer 62 not in immediate contact with silicon is not removed. Blanket platinum layer 62 remains on the surface of memory cell 40. The result of the single silicidation annealling step is shown in FIG. 6. Note that an upper portion of source/dram region 44 of memory cell 40 now includes a silicidized portion 64. Note also that platinum metal layer 62 remains on the surface c,f memory cell 40: At this point in the process, there is no specific electrical connection between metal layer 62 and silicidized portion 64. The electrical isolation layer 62 and silicidized portion 64 is explained in further detail below with respect to FIGS. 10–13.

Figure 7:
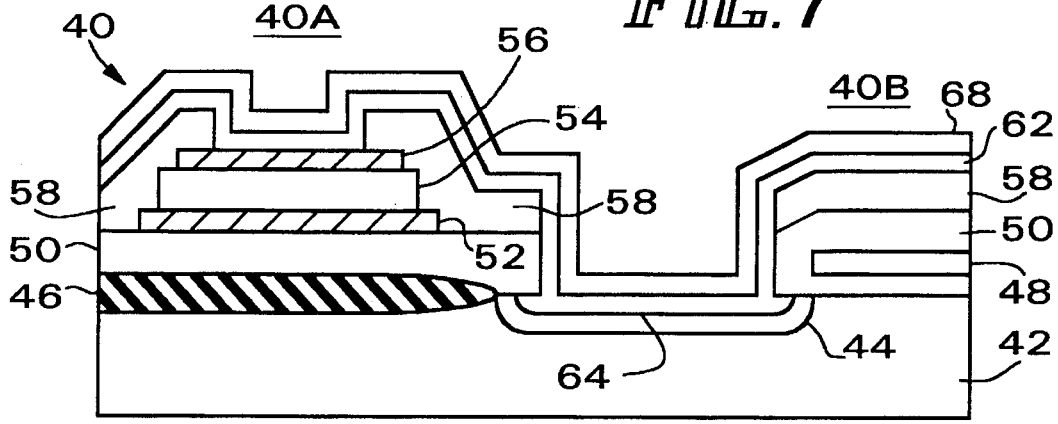

Referring now to FIG. 7, a second blanket metal layer 68 of titanium nitride (TiN) is deposited on the surface of memory cell 40, i.e. the surface of the first blanket metal 62, which remains unetched. Before metal layer 68 is deposited, a brief in situ sputter precleaning step is performed that removes about fifty Angstroms of equivalent thermal oxide. Once patterned and etched, both of the metal layers 62 and 68 will form the local interconnect for the memory cell 40, providing the desired electrical connection between ferroelectric capacitor 40A and transistor 40B. A blanket layer 68 of titanium is reactively sputtered onto the surface of blanket layer 62 in a nitrogen ambient environment to a thickness of about 500 to 1000 Angstroms.

Figure 8:
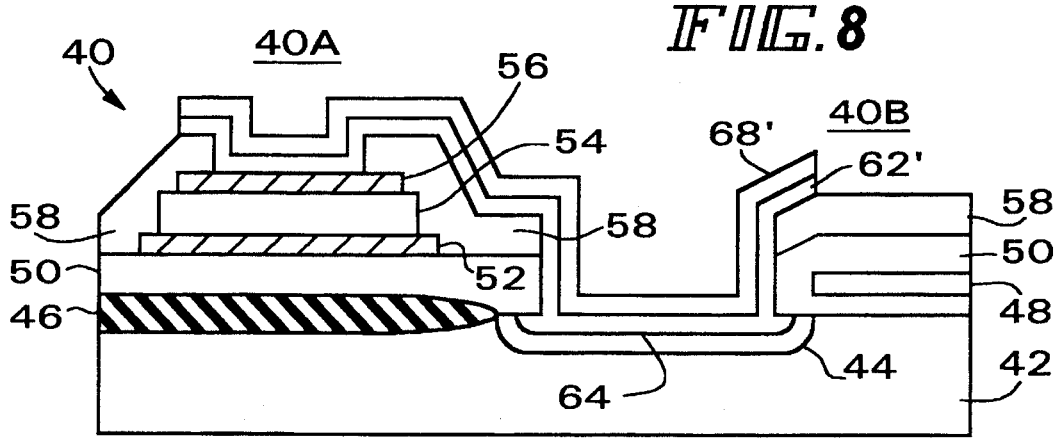

As shown in FIG. 8, dual blanket metal layers 62 and 68 are etched to form a local interconnect metallization strap 62', 68' that establishes a low resistivity conductive path between top electrode 56 of capacitor stack 40A, and silicidized source/drain region 44 of transistor 40B. The resultant resistivity of the metallization strap 62', 68' used to form the local interconnect is less than 10 ohms per square. FIG. 8 shows the; blanket metal layers 62 and 68 once they have been patterned and etched using conventional photolithography and etching techniques to form local interconnect 62', 68'. These conventional techniques include, but are not limited to: applying a photoresist layer to the surface of the second metal layer, patterning the photoresist layer, and selectively etching the first and second metal layers during a single etching step according to a pattern established in the photoresist layer. The same pattern is used to etch metal layers 62 and 68, and they are etched together in a single etching step, enhancing manufacturability of the local interconnect process. Memory cell 40 is thus complete except for the contacting of and metallization to the other source/drain region of transistor 40B, which is not shown in FIG. 8.

It should be noted with respect to FIGS. 3–8 that additional layers can be included in capacitor stack 40A if desired. Specifically, bottom electrode 52 can further include an adhesion layer comprised of titanium to enable the bottom electrode 52 to stick to reflow oxide layer 50. The adhesion layer is desirably about 100 to 300 Angstroms thick. Additionally, top electrode 56 can include a barrier layer comprised of titanium nitride to prevent platinum top electrode 56 from contacting a subsequent aluminum metallization layer, if such a layer is used. A barrier layer is not needed in memory cell 40 as shown in FIGS. 3–8, however, because top electrode 56 is metallized with a platinum/titanium nitride local interconnect 62', 68' and not an aluminum metallization layer.

Figure 9:
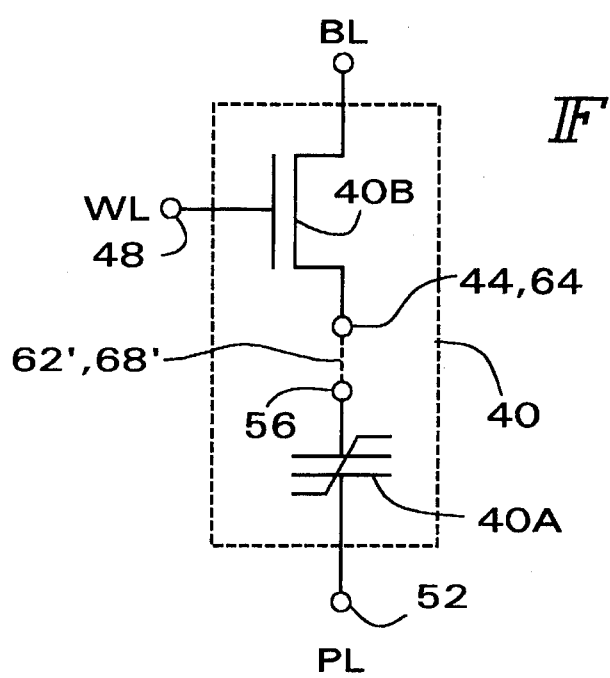
FIG. 9 is a schematic diagram of a 1T-1C ferroelectric memory cell corresponding to the one shown in FIGS. 3–8.

An equivalent electrical schematic of a ferroelectric memory cell 40 is shown in FIG. 9. Memory cell 40 includes a gating transistor 40B and a ferroelectric capacitor 40A. The top electrode of capacitor 40A is designated 56 to correspond to top electrode 56 shown in FIGS. 3–8. Similarly, the bottom electrode of capacitor 40A is designated 52 to correspond to the bottom electrode 52 shown in FIGS. 3–8. The bottom electrode node of capacitor 10A is also designated "PL", which stands for a "plate line" that is energized when reading from and writing to ferroelectric memory cell 40. The gate of transistor 40B is designated 48 to correspond to the gate shown in FIGS. 3–8, and is also designated "WL", corresponding to the word line connection used in a typical ferroelectric memory cell. The "top" source/drain region of transistor is designated "BL", corresponding to the bit line connection used in a typical ferroelectric memory cell. There is no corresponding designation numeral because this feature of the memory cell is not illustrated in FIGS. 3–8. The "bottom" source/drain region of transistor 40B is designated 44, 64, which corresponds to the silicidized source/drain region 44 shown in FIGS. 6–8. Finally, the desired local interconnect 62', 68' is shown as a dotted line, which electrically connects ferroelectric capacitor 40A to transistor 40B to complete cell 40.

FIGS. 10–13 illustrate the silicidized source/drain region 44 and dual-layer local interconnect of the present invention in greater detail by focusing solely on source/drain region 44 and the immediate surrounding area. In FIG. 10, only substrate 42, source/drain region 44, reflow oxide layer 50, and opened contact 60 are shown. Thus, FIG. 10 corresponds to a portion of FIG. 4 immediately surrounding source/drain region 44, although thick field oxide layer 46 is not shown for clarity. In FIG. 11, the first platinum or palladium blanket metal layer 62 is shown in detail covering the surface of the memory cell 40. At this point in the process flow, there is electrical conductivity throughout metal layer 62. In FIG. 12, memory cell 40 is shown after the silicidation anneal has been performed. Note that silicidized portion 64 extends into and above source/drain region 44. Also note that there is now a discontinuity 63 between blanket metal layer 62 and each end of silicidized portion 64 of source/drain region 44. Discontinuity 63 is comprised of silicon dioxide ($SiO_2$), which is an electrical insulator that physically (the distance is small, about twenty to fifty Angstroms) and electrically isolates metal layer 62 from silicidized portion 64 of source/drain region 44. In FIG. 13, the second metal layer 68 composed of titanium nitride is formed, which effectively restores electrical connectivity throughout the first metal layer 62. That is, discontinuities 63 have been bridged by the second metal layer 68, which ensures electrical connectivity between all points coupled together by the local interconnect whether used in memory cell 40 or between other points in the ferroelectric memory integrated circuit.

Figure 14:
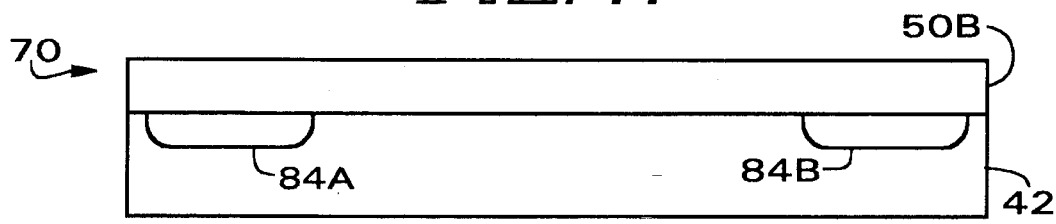
FIGS. 14 through 18 are cross sectional diagrams of a portion of the integrated circuit not associated with the memory cell, wherein two points on the integrated circuit are interconnected using the layered interconnect of the present invention, and wherein the resistivity thereof is reduced by running the local interconnect over an intervening silicon contact.
Figure 15:
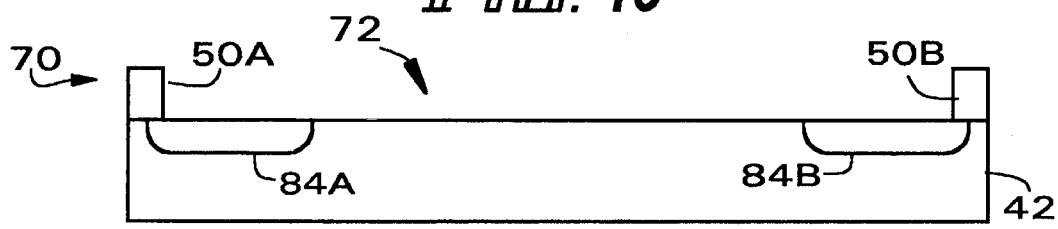
Figure 16:
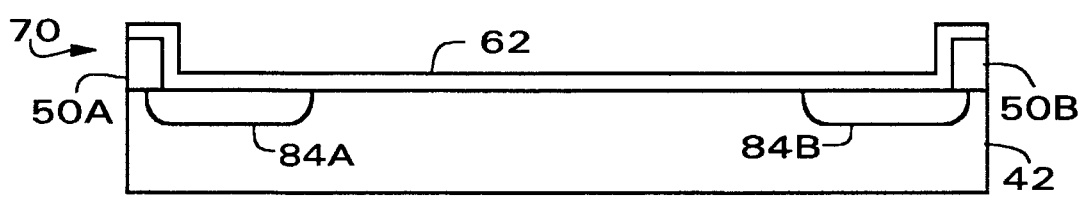

Turning now to FIGS. 14–18, a series of cross sectional diagrams illustrate a method of forming a low resistivity interconnect between a first point and a second point of a ferroelectric memory integrated circuit that can be accomplished simultaneously with the fabrication of the local interconnect in memory cell 40. FIG. 14 includes a portion 70 of an integrated circuit that contains a ferroelectric memory, but only a portion not associated directly with ferroelectric memory cell 40 is shown. Integrated circuit portion 70 shown in FIG. 14 includes a silicon substrate 42, a first "point" 84A and a second "point" 84B, which in FIG. 14 are shown to be diffused regions 84A and 84B, respectively, although other circuit features or devices can be used. First and second points 84A and 84B are desired to be electrically connected on the ferroelectric memory integrated circuit. In FIG. 14, diffused regions 84A and 84B are covered with oxide layer 50. In FIG. 15, a contact 72 to silicon substrate 42 is opened between first point 84A and second point 84B. Note that in FIG. 15, contact 72 exposes diffused areas or points 84A and 84B as well as the surface of the intervening undoped silicon substrate 42. Oxide layer 50 is now shown as separated into oxide layers 50A and 50B. Subsequently, a first blanket metal layer 62 comprised of platinum or palladium is formed on a top surface of the integrated circuit containing the ferroelectric memory. Metal layer 62 is formed as described above with respect to the local interconnect for memory cell 40. The subsequently metallized portion 70 of the ferroelectric memory is shown in FIG. 16.

Figure 17:
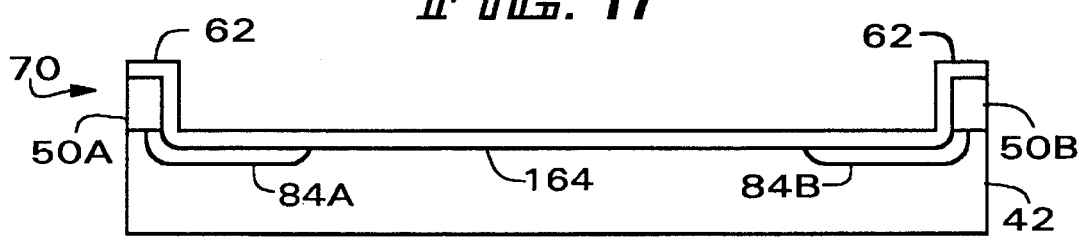
Figure 18:
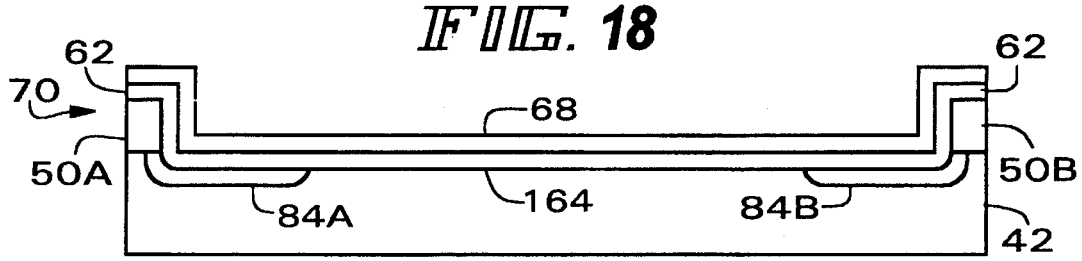

Once the first metal layer 62 is formed, it is annealed in the manner described above. Annealing the ferroelectric memory simultaneously recovers damage in a ferroelectric capacitor dielectric material used in the ferroelectric memory, and silicidizes first metal layer 62 in contact 72. A portion of first metal layer 62 that is silicidized in contact 72 becomes physically discontinuous with and electrically isolated from a remaining portion of first metal layer 62. The results of the annealing, step are shown in FIG. 17, wherein the silicidized portion 164 is not only driven into diffused areas 84A and 84B, but into the silicon substrate 42 between the two diffused areas. Once the entire integrated circuit, including portion 70 has been annealed, a second blanket metal layer 68 comprised of titanium nitride is formed on the top surface of first metal layer 62, as shown in FIG. 18. Metal layer 68 bridges the electrical discontinuities in metal layer 62. Once both metal layers 62 and 68 have been formed, they can be selectively etched to form a low resistivity interconnect between first point 84A and second point 84B of the integrated circuit as desired. Since the intervening silicon in substrate 42 between first and second points 84A and 84B has also be silicidized, the resistivity of the low resistivity interconnect is much less than ten ohms per square, with a resistivity of about two to three ohms per square or less if the majority of the interconnect is silicidized.

Figure 19:
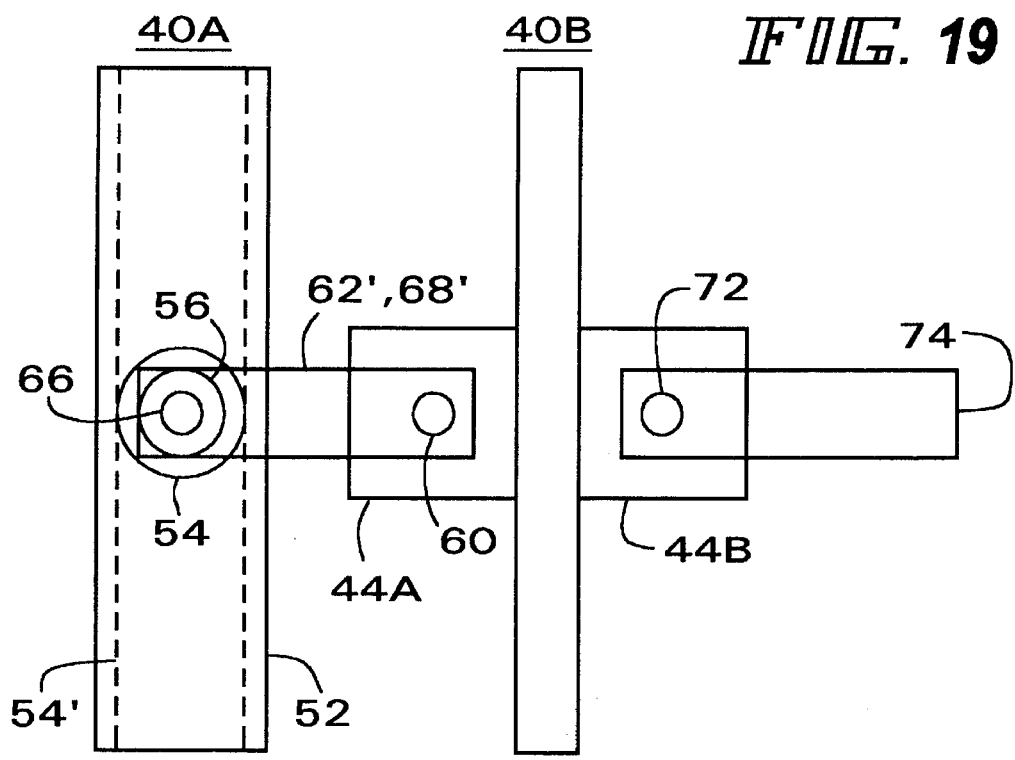
FIG. 19 is a plan view of a ferroelectric memory cell according to the present invention generally corresponding to the cross sectional view of FIG. 8.
Figure 20:
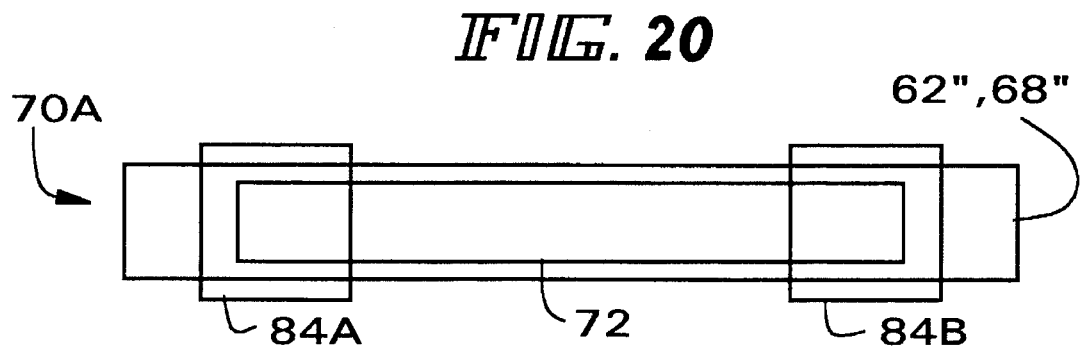
FIG. 20 is a plan view of a portion of an integrated circuit according to the present invention generally corresponding to the cross sectional view of FIG. 18.
Figure 21:
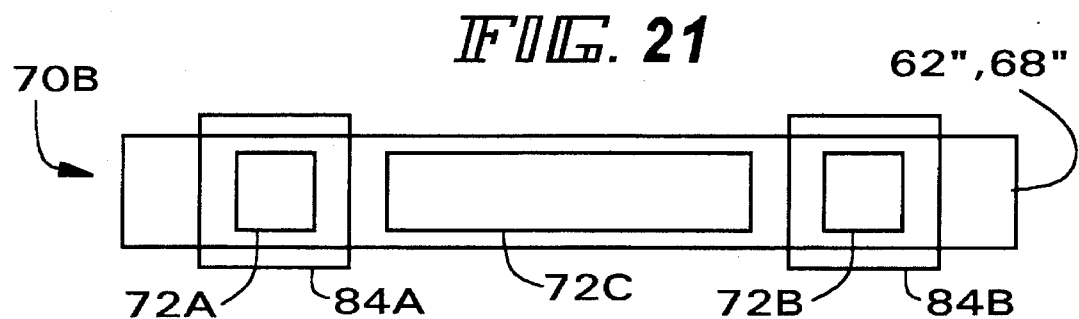
FIG. 21 is a plan view of a portion of an integrated circuit that is similar to FIG. 20, but in which the silicon contact is slightly modified.

A plan view of the local interconnect used in memory cell 40 and non-memory cell portions 70 of the ferroelectric memory integrated circuit is shown in FIGS. 19–21. In FIG. 19, which corresponds generally to the cross sectional view of FIG. 8, memory cell 40 includes ferroelectric capacitor located generally at 40A and MOS transistor located generally at 40B. It is important to note, however, that the plan view of FIG. 19 is not the only manner in which a transistor and a ferroelectric capacitor can be connected to form a memory cell. The layout of the memory cell is a design choice. The ferroelectric capacitor, for example, can be placed on top of the transistor to save cell area, if desired.

Ferroelectric capacitor 40 includes bottom electrode 52, which is shown to be a plate line in FIG. 24A, ferroelectric dielectric layer 54, and top electrode 56. Ferroelectric dielectric layer 54 can be extended, if desired, in the manner shown by alternative dielectric layer 54'. Contact 66 through the oxide layers is shown as a black circle in FIG. 19, although the individual oxide layers themselves have been omitted for clarity. MOS transistor 40B includes source/drain regions 44A and 44B, that are electrically isolated and separated by gate 48, which is shown to be part of a word line in FIG. 19. Local interconnect 62', 68' electrically connects capacitor 40A through contact 66 and transistor 40B through contact 60 of source/drain region 44. The other source/drain region of transistor 40B is metallized through contact 72 with bit line metallization 74, which is normally comprised of aluminum/silicon/copper, and is about 5000 to 8000 Angstroms thick.

Referring now to FIG. 20, a plan view of a portion 70A of a ferroelectric memory integrated circuit generally corresponding to the cross sectional view of FIG. 18 is shown that includes diffused regions 84A and 84B, contact 72, and low resistivity interconnect 62", 68". Similarly, FIG. 21 is a plan view of a portion 70B of a ferroelectric memory integrated circuit that includes diffused regions 84A and 84B, alternative contacts 72A, 72B, and 72C, and low resistivity interconnect 62", 68". The only difference between the two plan views described is that in FIG. 21, there is oxide between contacts 72A and 72C, and between contacts 72B and 72C. Contacts 72A–C can be modified as desired.

Having described and illustrated the principles of the invention in a preferred embodiment thereof, it is appreciated by those having skill in the art that the invention can be modified in arrangement and detail without departing from such principles. I therefore claim all modifications and variation coming within the spirit and scope of the following claims.

I claim:

1. A method of forming a local interconnect for a partially processed ferroelectric memory cell, the method comprising the steps of:

simultaneously opening top electrode and source/drain contacts to the ferroelectric memory cell;

forming a first blanket metal layer comprised of platinum or palladium on a top surface of the ferroelectric memory cell;

annealing the ferroelectric memory cell to simultaneously recover damage in a ferroelectric capacitor dielectric of the memory cell, and to silicidize the first metal layer in the source/drain contact, whereby a portion of the first metal layer that is silicidized in the source/drain contact becomes physically discontinuous with and electrically isolated from a remaining portion of the first metal layer;

forming a second blanket metal layer comprised of titanium nitride on a top surface of the first metal layer; and selectively etching the first and second metal layers to form the local interconnect between the top electrode and source/drain contacts of the ferroelectric memory cell.

2. The method of claim 1 in which the step of forming a first metal layer comprises the step of forming a first metal layer about 300 to 500 Angstroms thick.

3. The method of claim 1 in which the step of forming a first metal layer comprises the step of sputtering platinum or palladium in an argon ambient environment.

4. The method of claim 1 in which the annealing step comprises the step of annealing the ferroelectric memory cell at a temperature between 450° and 700° C.

5. The method of claim 1 in which the annealing step is performed for a duration of between 30 and 90 minutes.

6. The method of claim 1 in which the annealing step is performed in an oxygen ambient environment.

7. The method of claim 1 in which the step of forming a second metal layer comprises the step of forming a second metal layer about 500 to 1000 Angstroms thick.

8. The method of claim 1 in which the step of forming a second metal layer comprises the step of sputtering titanium in a nitrogen ambient environment.

9. The method of claim 1 in which the selective etching step comprises the steps of:

applying a photoresist layer to the surface of the second metal layer;

patterning the photoresist layer; and selectively etching the first and second metal layers during a single etching step according to a pattern established in the photoresist layer.

10. The method of claim 1 further comprising the step of controlling the thicknesses of the first and second metal layers so that the sheet resistance of the local interconnect is less than ten ohms per square.

11. A method of forming a low resistivity interconnect between a first point and a second point of an integrated circuit ferroelectric memory, the method comprising the steps of:

opening a contact to a silicon substrate between the first point and the second point;

forming a first blanket metal layer comprised of platinum or palladium on a top surface of the ferroelectric memory;

annealing the ferroelectric memory to simultaneously recover damage in a ferroelectric capacitor dielectric material used in the ferroelectric memory, and to silicidize the first metal layer in the contact, whereby a portion of the first metal layer that is silicidized in the contact becomes physically discontinuous with and electrically isolated from a remaining portion of the first metal layer;

forming a second blanket metal layer comprised of titanium nitride on a top surface of the first metal layer; and selectively etching the first and second metal layers to form the low resistivity interconnect between the first point and the second point of the integrated circuit.

12. The method of claim 11 in which the step of forming a first metal layer comprises the step of sputtering platinum or palladium in an argon ambient environment to a thickness of about 300 to 500 Angstroms.

13. The method of claim 11 in which the annealing step comprises the step of annealing the ferroelectric memory at a temperature between 450° and 700° C. for a duration of between 30 and 90 minutes in an oxygen ambient environment.

14. The method of claim 11 in which the step of forming a second metal layer comprises the step of sputtering titanium in a nitrogen ambient environment to a thickness of about 500 to 1000 Angstroms.

15. The method of claim 11 in which the selective etching step comprises the steps of:

applying a photoresist layer to the surface of the second metal layer;

patterning the photoresist layer; and selectively etching the first and second metal layers during a single etching step according to a pattern established in the photoresist layer.

16. The method of claim 11 further comprising the step of controlling the thicknesses of the first and second metal layers so that the sheet resistance of the low resistivity interconnect passing over silicidized silicon is less than two ohms per square.

17. A metallization method for an integrated circuit ferroelectric memory, the method comprising the steps of:

simultaneously opening top electrode and source/drain contacts to a ferroelectric memory cell, and at least one separate substrate contact between two predetermined points in the memory;

forming a first blanket metal layer comprised of platinum or palladium on a top surface of the ferroelectric memory;

annealing the ferroelectric memory in an oxygen ambient environment to simultaneously recover damage in a ferroelectric capacitor dielectric material used in the ferroelectric memory, and to silicidize the first metal layer in the source/drain and substrate contacts, whereby a portion of the first metal layer that is silicidized in the source/drain and substrate contacts becomes physically discontinuous with and electrically isolated from a remaining portion of the first metal layer;

forming a second blanket metal layer comprised of titanium nitride on a top surface of the first metal layer; and selectively etching the first and second metal layers to form a local interconnect between the top electrode and source/drain contacts of the ferroelectric memory cell, as well as a low resistivity interconnect between the two predetermined points in the memory.

18. The method of claim 17 in which the annealing step comprises the step of annealing the ferroelectric memory at a temperature between 450° and 700° C. for a duration of between 30 and 90 minutes.

19. The method of claim 17 in which the selective etching step comprises the steps of:

applying a photoresist layer to the surface of the second metal layer;

patterning the photoresist layer; and selectively etching the first and second metal layers during a single etching step according to a pattern established in the photoresist layer.

20. The method of claim 17 further comprising the step of controlling the thicknesses of the first and second metal layers so that the sheet resistance of the local interconnect and low resistivity interconnect is less than ten ohms per square.

* * * * *